United States Patent
Yang et al.

(10) Patent No.: US 6,175,523 B1
(45) Date of Patent: Jan. 16, 2001

(54) PRECHARGING MECHANISM AND METHOD FOR NAND-BASED FLASH MEMORY DEVICES

(75) Inventors: Andrew Yang, Sunnyvale; Shane Hollmer, San Jose; Binh Q. Le, Mountain View, all of CA (US)

(73) Assignee: Advanced Micro Devices, INC, Sunnyvale, CA (US)

( * ) Notice: Under 35 U.S.C. 154(b), the term of this patent shall be extended for 0 days.

(21) Appl. No.: 09/433,187

(22) Filed: Oct. 25, 1999

(51) Int. Cl.$^7$ .................................................. G11C 16/06
(52) U.S. Cl. ................................ 365/185.25; 365/185.17
(58) Field of Search ...................... 365/185.25, 185.17, 365/185.21, 185.03, 203

(56) References Cited

U.S. PATENT DOCUMENTS

| | | |
|---|---|---|
| 4,173,766 | 11/1979 | Hayes . |
| 5,280,446 | 1/1994 | Ma et al. . |
| 5,349,221 | 9/1994 | Shimoji . |
| 5,748,529 * | 5/1998 | Lee .................................. 365/185.17 |
| 5,748,536 * | 5/1998 | Kwon et al. ..................... 365/185.25 |
| 5,768,192 | 6/1998 | Eitan . |
| 5,825,686 | 10/1998 | Schmitt-Landsiedel et al. . |
| 5,847,998 | 12/1998 | Van Burkirk . |
| 5,867,430 | 2/1999 | Chen et al. . |
| 5,986,929 * | 11/1999 | Sugiura et al. .................. 365/185.03 |
| 6,055,188 * | 4/2000 | Takeuchi et al. ............... 365/185.22 |
| 6,058,042 * | 5/2000 | Nobukata ........................ 365/185.03 |

FOREIGN PATENT DOCUMENTS

| | | |
|---|---|---|
| 2 157 489 | 10/1985 | (GB) . |
| WO 99/07000 | 2/1999 | (WO) . |

* cited by examiner

Primary Examiner—Son Mai
(74) Attorney, Agent, or Firm—Brinks Hofer Gilson & Lione

(57) ABSTRACT

A flash memory device includes an array of core cell blocks and page buffers with supporting input/output circuitry. The flash memory device, in addition, contains a mechanism for precharging the bitline line of each page buffer prior to the sensing/evaluation cycle of a particular memory element in each core cell block. The precharging mechanism increases the speed of response in retrieving information from each core cell block because the bitline line is charged to a predetermined voltage prior to accessing the bitline. The precharging mechanism includes a first transistor connected between a power supply and the bitline that is operational during the precharge cycle and causes the bitline to charge to the predetermined voltage. The precharging mechanism also includes a second transistor connected between a latch disposed in the page buffer and ground. The second transistor grounds the latch prior to the start of the evaluation cycle.

18 Claims, 5 Drawing Sheets

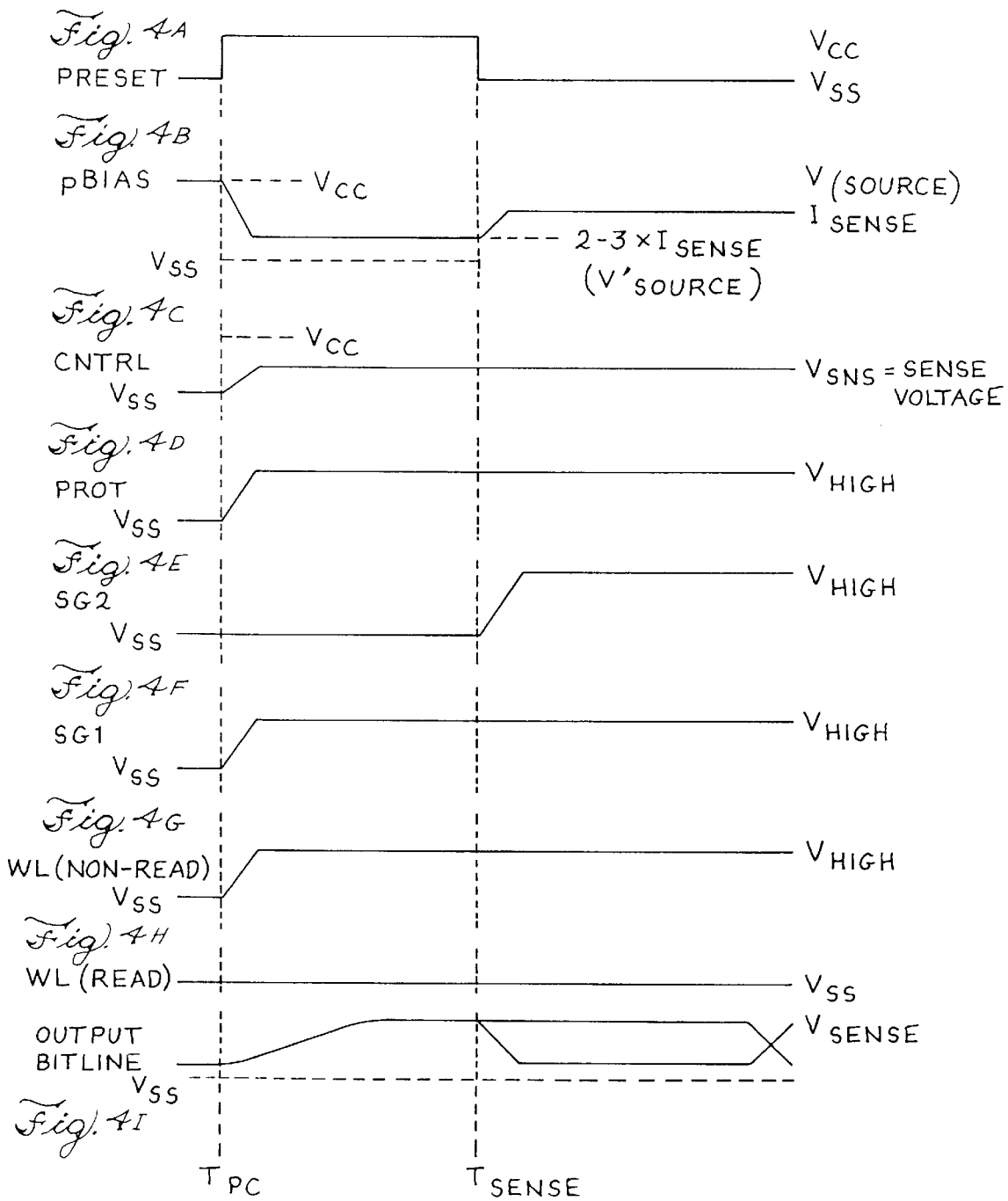

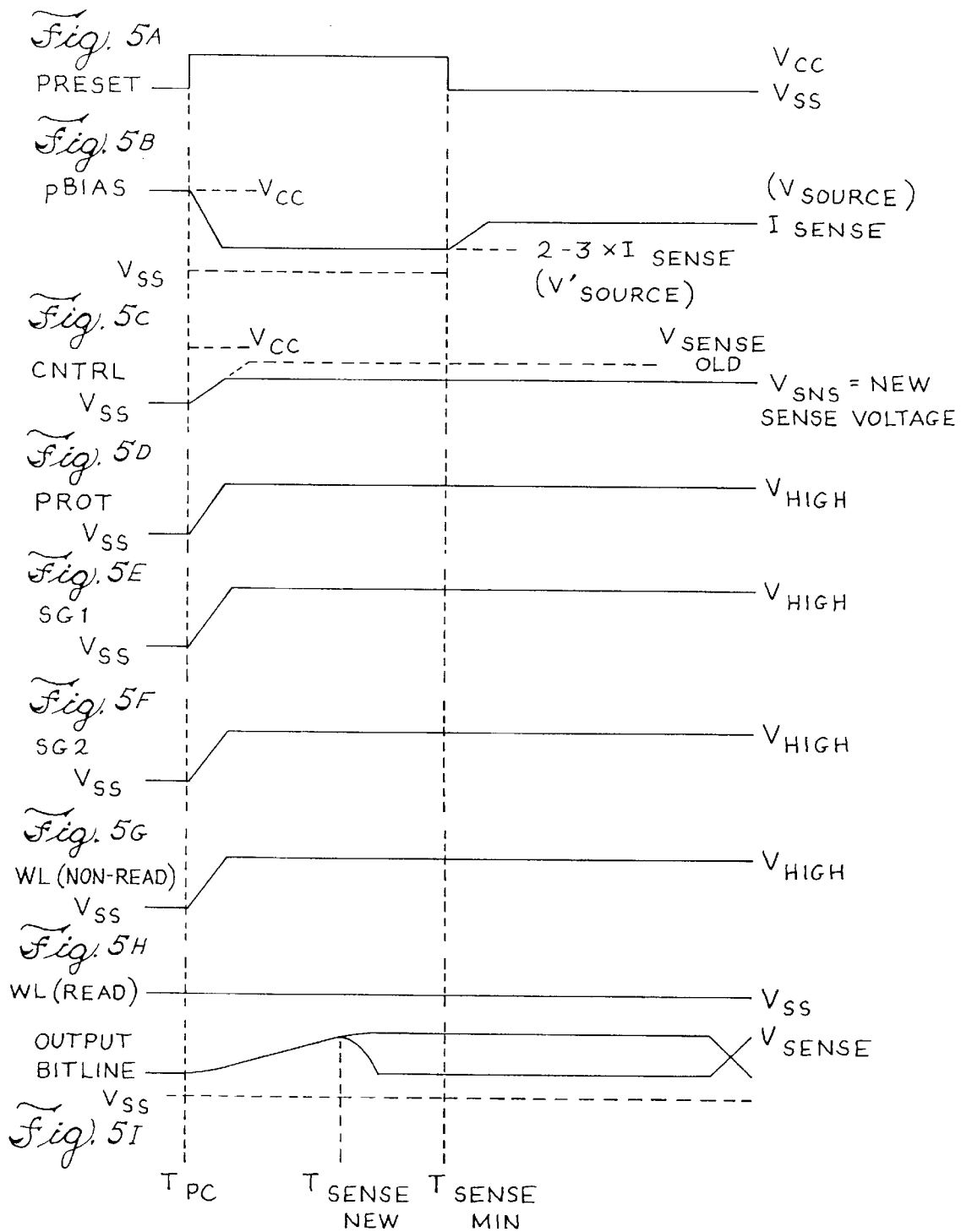

PRECHARGING MECHANISM AND METHOD FOR NAND-BASED FLASH MEMORY DEVICES

FIELD OF THE INVENTION

The present invention relates to the field of flash memory devices. More particularly, the invention relates to both a mechanism and method for precharging NAND-based flash memory devices.

BACKGROUND OF THE INVENTION

The overall array architecture for memory section of a typical NAND-based flash memory device comprises a core memory accessed by an upper and lower bank of page buffers and a right and left bank of word line decoders. The core memory contains information stored in blocks of memory and individual memory cells within the blocks. The right and left word line decoders are used to access specific memory cells within each memory block and the upper and lower bank of page buffers provide the input and output circuitry for each memory cell.

The architecture of one core cell block in the typical NAND-based flash memory device comprises the individual memory elements and select gates. The memory elements and select gates are embodied in non-volatile, floating gate transistors that may be programmed to a logic state of 0, 1, or other states depending on the particular type of transistor and programming used. The control gates of the transistors that comprise the individual memory elements and select gates in each core cell block are addressed by word lines controlled by the addressing system. The memory elements are connected in series with each other and the select gates. The select gates, at the ends of the chain of memory cells, are connected with either the array common voltage Vss or a bitline. A page buffer is connected with a core cell block via a bitline. The page buffer includes transistors and supporting circuitry that regulate the flow of data into and out of the core cell block and into and out of the external system.

One problem of the above architecture is that the bitline inherently has a large capacitance and thus has a relatively slow speed of response when data is extracted, i.e. read, from memory elements due to the necessary charging and discharging time of the bitline connected with each cell. Typically, the time it takes to charge the bitline to the voltage level necessary for sensing is larger than the time it takes to discharge the bitline. Thus, to decrease the cycle time for reading a specific word line, it is more advantageous to produce a mechanism or method to decrease the charging time rather than the discharging time of each bitline to be read.

BRIEF SUMMARY OF THE INVENTION

In view of the above, a precharging mechanism and method of precharging a flash memory device is provided.

A first aspect of the present invention is directed towards a method for precharging a flash memory device. The flash memory device comprises a plurality of core cell blocks containing flash memory cells, a plurality of page buffers and a plurality of bitlines. Each of the page buffers is in communication with all of the core cell blocks via a unique bitline. The method includes charging at least one of the bitlines to a preset voltage during a portion of a precharge cycle. The logic state of at least one of the flash memory cells is evaluated during the precharge cycle after the bitlines have attained the preset voltage. Each of the flash memory cells undergoing evaluation is connected with a unique bitline.

In addition, each page buffer in the flash memory device additionally may comprise a latch and a transistor connected with both the latch and ground. The method according to the first aspect of the invention further comprises grounding one side of the latch contained in at least each page buffer connected with every bitline being charged via the transistor. The grounding occurs prior to the bitlines attaining the preset voltage.

A second aspect of the present invention is also directed towards a method for precharging a flash memory device. The flash memory device comprises a plurality of core cell blocks containing flash memory cells, a plurality of page buffers and a plurality of bitlines. Each of the page buffers is in communication with all of the core cell blocks via a unique bitline. The method includes charging at least one of the bitlines to a preset voltage during a portion of a precharge cycle. Additionally, the preset voltage may be maintained for the duration of the precharge cycle. The logic state of at least one of the flash memory cells may be evaluated during an evaluation cycle. The evaluation cycle occurs after the precharge cycle. Each of the flash memory cells undergoing evaluation is connected with a unique bitline.

Additionally in the second aspect of the invention, each page buffer in the flash memory device comprises a latch and a transistor connected with both the latch and ground. The method according to the first aspect of the invention further comprises grounding one side of the latch contained in at least each page buffer connected with every bitline being charged via the transistor. The grounding occurs prior to the evaluation cycle.

A third aspect of the present invention is directed towards a precharging mechanism for a flash memory device. The precharging mechanism comprises at least one core cell, at least one memory element contained within each core cell, at least one page buffer, at least one address line and at least one bitline. Each memory element is addressed by one of the address lines. Each bitline has a bitline voltage and data is produced on at least one of the bitlines by a unique memory element connected with the bitline.

In the third aspect of the invention, each of the page buffers also contains a precharging mechanism operative to precharge at least one bitline to a predetermined voltage. The bitline is charged via a first current before a predetermined memory element contained in at least one core cell is addressed. A second current is present in the bitline after the predetermined voltage has been attained.

In a further embodiment of the third aspect of the present invention, each page buffer further comprises a latch and a transistor. The transistor is connected with both one side of the latch and ground and serves to ground one side of the latch prior to the predetermined voltage being attained.

It is therefore a primary advantage of the present invention to increase the speed of response of the flash device by decreasing the charging time associated with the evaluation cycle. The decrease in the charging time may be accomplished by using either a precharge mechanism or method to precharge the bitline before reading the data from a particular word line.

The following figures and detailed description of the preferred embodiments will more clearly demonstrate these and other objects and advantages of the invention.

BRIEF DESCRIPTION OF SEVERAL VIEWS OF THE DRAWINGS

FIGS. 4A–I show the timing diagrams for reading data from a particular memory cell according to the first embodiment of the present invention;

FIGS. 5A–I show the timing diagrams for reading data from a particular memory cell according to the second embodiment of the present invention.

DETAILED DESCRIPTION OF THE PRESENTLY PREFERRED EMBODIMENTS OF THE INVENTION

Figure 1:
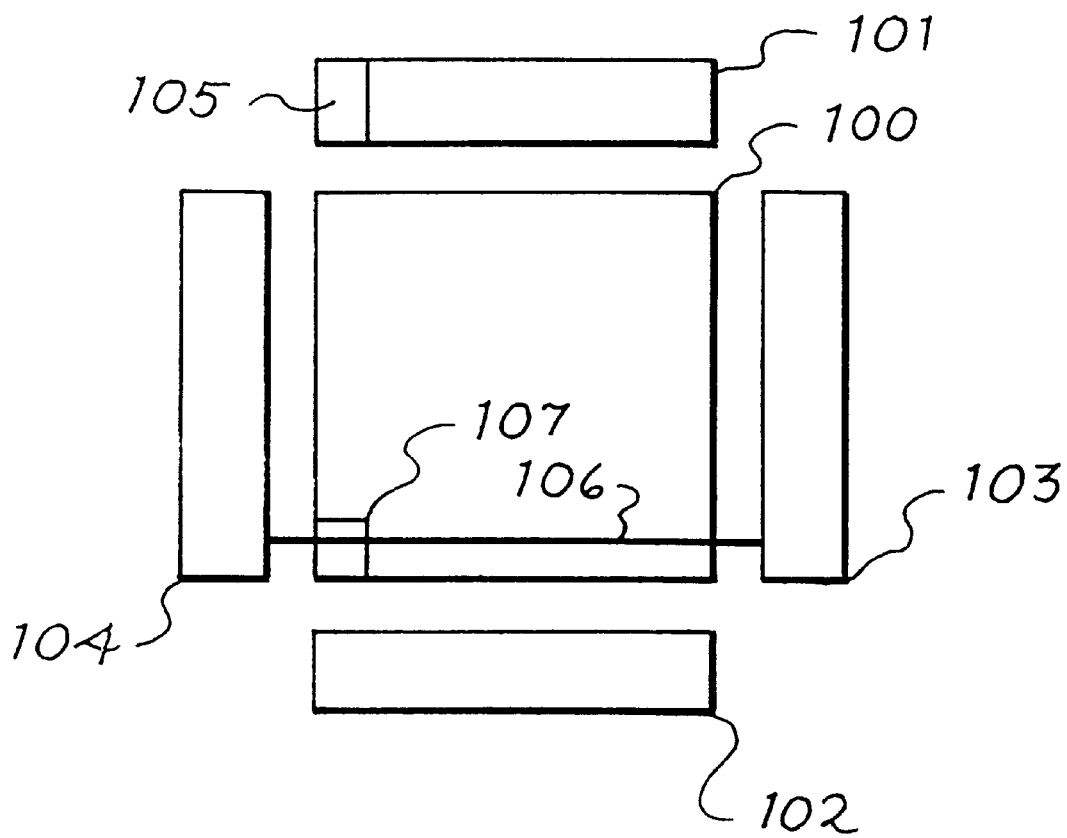
FIG. 1 shows the overall architecture of the memory elements of the NAND-based flash device according to the invention.

The array architecture associated with the memory device is shown in FIG. 1. The array contains N individual page buffers 105 in each bank of page buffers 101, 102; thus, as there are both an upper 101 and lower 102 bank of page buffers, one entire page or word line 106 contains 2N bits. Left 103 and right 104 banks of decoders are used to select a particular word line. The core memory 100 is split into a set of M core cell blocks 107 with each core cell block 107 being L pages wide. This results in a 2N bits/page×L pages/core cell block×M core cell blocks/core memory=2× L×M×N bytes/core memory. One example of an array architecture used is 256 individual page buffers, a set of 1024 core cell blocks with each core cell block being 16 pages wide. This results in a 2×256 bytes/page×16 pages/ core cell block×1024 core cell blocks/core memory=8M bytes/core memory. Of course, any numbers presented here are merely illustrative of the principle of the invention as a whole. Those ordinarily skilled in the art will appreciate that the numbers associated with any of these elements, as well as the number of core memory cells in the overall device, may be changed without departing from the spirit and scope of the invention.

Figure 2:
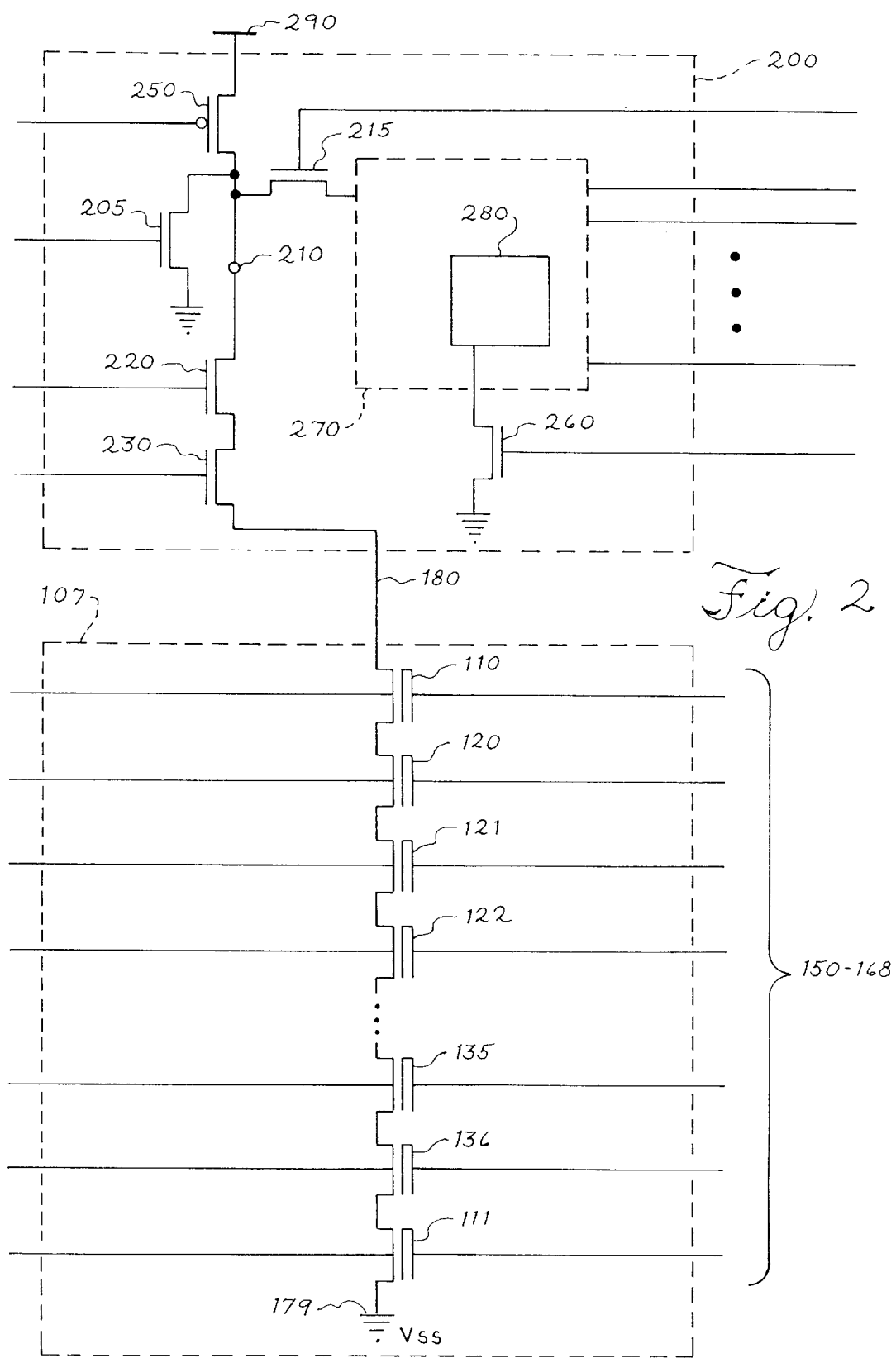
FIG. 2 shows the architecture of one core cell block along with the associated page buffer in a NAND-based flash memory device according to the invention.

FIG. 2 shows the architecture of one core cell block 107 in the NAND-based flash memory device of FIG. 1 along with the associated page buffer 105. The core cell block 107 comprises 16 individual memory elements 120–136 and two select gates, SG1 110 and SG2 111, for example. As stated before, non-volatile transistors embody the memory elements 120–136 and select gates 110, 111. The word lines 151–167 and select gate lines 150,168 are connected with the control gates of the memory elements 120–136 and select gates 110,111. The memory elements 120–136 and select gates are connected in series. Specifically, the source and drain of the memory elements 120–136 are connected to each other in series. Thus, the source of the first memory element 120 is tied to the drain of the second memory element 121, the source of the second memory element 121 is tied to the drain of the third memory element 122, etc. Accordingly, the select gates 110, 111 are connected to the ends of the chain of memory elements 120–136. The source of SG1 110 is connected with the drain of the first memory element 120, while the drain of SG1 110 is connected with a bitline 180. Similarly, the drain of SG2 111 is connected with the source of the last memory cell 136 and the source of SG2 111 is connected with the array common voltage Vss 199.

The core cell block 107 is connected with a page buffer 105 via a bitline 180. The page buffer 105 includes a sensing node 210, a high voltage control transistor (CNTRL) 220, an optional protection transistor (PROT) 230, a transistor for discharging the bitline 205, an isolation transistor 215, and other necessary circuitry 270 well known in the art. The other circuitry 270 may include, for example, a latch 280 for latching data onto and out of the bitline 180, input/output circuitry for transferring data to the external system and assorted supporting circuitry inherent in the other circuitry 270. Further, the isolation transistor 215 isolates the bitline 180 from the necessary circuitry 270 during specific operations and the discharging transistor 205 is used to discharge the bitline 180 when necessary. Similarly, the PROT transistor 230 is a high voltage n-channel transistor used for protecting the circuitry in the page buffer 105 and the memory circuitry in the core cell block 107. The PROT transistor 230 is optional, depending on the specific circuit design.

The page buffer 105, according to the invention, in addition comprises a prebias (pBIAS) transistor 250. The pBIAS transistor 250 is connected with the CNTRL transistor 220 such that the drain of CNTRL 220 is connected with the drain of pBIAS 250, with the SNS node 210 located between the two transistors. The source of pBIAS 250 is connected with the supply voltage Vcc 290, and the source of CNTRL 220 is connected with the bitline 180. The pBIAS transistor 250 is a p-channel transistor, unlike the majority of the other transistors and memory elements in the core cell block 107 and page buffer 105, which are n-channel transistors. The pBIAS transistor 250 allows the bitline 180 to charge up to a preset voltage prior to detection of the output voltage at the sensing node 210 and also provides the sensing current.

The page buffer circuitry 105 comprises an additional n-channel transistor, the PRESET transistor 260 is provided for timing purposes. The n-channel PRESET transistor 260, herein the PRESET transistor, is operational to ground one node of the latch 280 isolated by the isolation transistor 215. The PRESET transistor 260 is activated during the precharging cycle so that the latch 280 is set to a known state before sensing begins. The addition of the PRESET transistor 260 is necessary for purposes of timing of signals associated with external elements of the flash memory device.

Figure 3A:
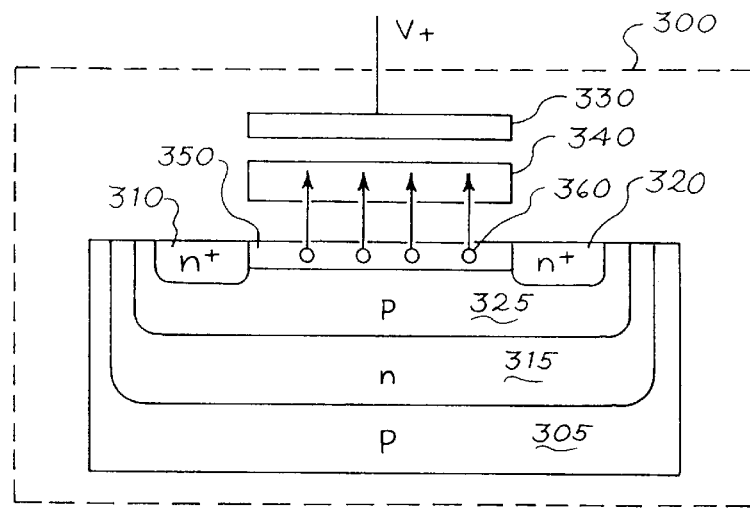
FIGS. 3A, 3B, 3C depict individual memory cell under different operating conditions.
Figure 3B:
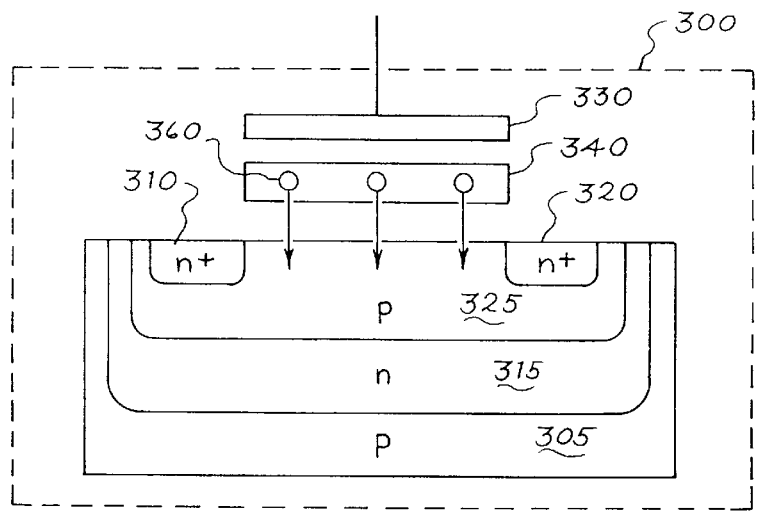
Figure 3C:
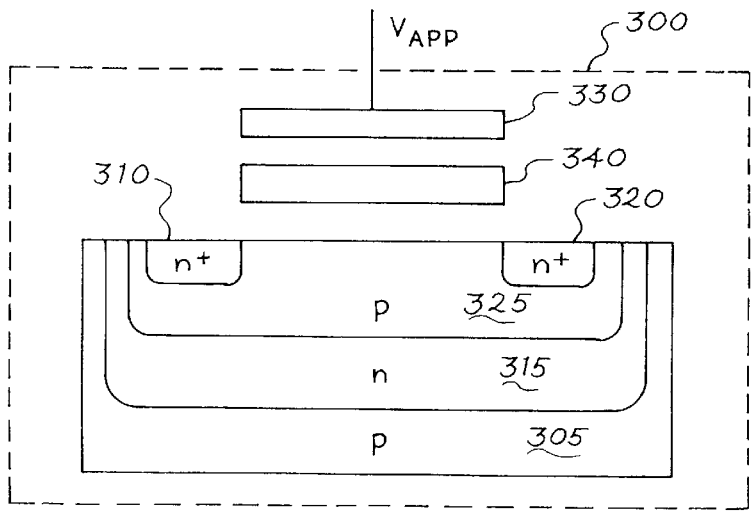

Individual memory elements can undergo three distinct operations, which are shown in FIGS. 3A, 3B and 3C. The three operations are Program, shown in FIG. 3A, Erase, shown in FIG. 3B, and Read, shown in FIG. 3C, and are described below. This discussion will be limited to standard, n-channel, NAND-based non-volatile memory elements, although those ordinarily skilled in the art will appreciate that the basic operations described herein can be easily extended to at least NOR-based non-volatile memory elements and bi-level non-volatile memory elements in which 4 states can be programmed.

The structure of the memory element 300 is well known in the art: a p-type semiconductor well 325 is disposed within a n-type semiconductor well 315. The n-type semiconductor well 315 is contained within a p-type semiconductor substrate 305. A set of n-type semiconductor junctions comprising the source 310 and drain 320 are disposed within the p-type semiconductor well 325. The p-type semiconductor well 325 and n-type semiconductor well 315 are usually maintained at the same voltage during device operation to avoid current flow from one of the well regions to the other.

The memory element further includes a control gate 330 and a floating gate 340. The gates 330, 340 are conventionally formed from polysilicon deposited and patterned on the surface of the substrate, although the floating gate 340 may alternately be formed from an ONO layer. The gates 330, 340 are formed such that an oxide is formed on part of the substrate with the floating gate 340 formed above the oxide. The control gate 330 is formed above the floating gate 340 and isolated from the floating gate 340 by a second oxide. Control signals are applied to the control gate 330.

During the program operation, as shown in FIG. 3A, both the source 310 and the drain 320 of the memory element 300 are connected with Vss (usually ground). Prior to programming, the threshold voltage (or turn-on voltage) of the MOSFET is generally designed to be a negative voltage, so that a channel 350 of electrons 360 exists in the p-type semiconductor well 325 when the gate 330 is grounded. The channel 350 is disposed between the source 310 and drain 320 of the memory element 300. A large positive voltage is applied to the control gate 330, which causes electrons 360 to be trapped onto the floating gate 340 via Fowler-Nordheim tunneling. The threshold voltage of the transistor is increased if electrons are trapped on the floating gate 340. In this case, the threshold voltage of the programmed memory element changes from a negative voltage to a positive voltage.

During the erase operation, as shown in FIG. 3B, the source 310 and the drain 320 of the memory element 300 are left floating while the control gate 330 is grounded at Vss. A large positive voltage is applied to both the p-type semiconductor well 325 and the n-type semiconductor well 315. As a consequence, the electrons 360 trapped on the floating gate 340 enter the p-type semiconductor well 325 via Fowler-Nordheim tunneling. The threshold voltage thus reverts to the original, unprogrammed threshold voltage of the transistor.

During the read operation, as shown in FIG. 3C, the source 310 of the memory element 300 is connected with Vss while the drain is connected with the bitline 180. The voltage applied to the control gate 330 of the memory element 300 is between the threshold voltage of memory elements that have been erased and memory elements that have been programmed. In this case, the threshold voltage of a programmed memory element is positive and that of an erased memory element is negative and thus applying Vss to the control gate 330 is sufficient to differentiate between the two states. The voltage or current is determined at a sense node 210 on the bitline 180 to ascertain the state of the particular memory element selected, either programmed (0) or erased (1).

The preferred embodiment to sensing a specific word line is to charge the bitline before the specific word line is addressed. The bitline is initially charged up to a value close to a predetermined sensing level and then isolated or left floating. Each word line is connected with the control gate of a unique memory element in each core memory cell. In a standard NAND-type flash memory device, to test a specific word line, all of the word line voltages not being tested and the select gate voltages are held at a high enough voltage level to turn the memory element on or open the channel of the transistor. The applied voltage must be greater than the voltage necessary to turn on a programmed memory element, whose threshold voltage is large, as well as an erased memory element, whose threshold voltage is substantially smaller.

As mentioned above, the voltage applied along the specific word line of the memory element to be read must be between the voltage necessary to read an erased memory cell and that necessary to read a programmed memory cell. If the specific memory cell being read has been erased, when the test voltage is applied, a complete circuit from the bitline to ground is created and the bitline discharges. After a specific amount of time, the voltage on the bitline is read at the sensing node (SNS). At this time, if the voltage at the SNS node is approximately the original sensing level, 1.0 V for example, then the circuit connecting the bitline to ground was not completed and the memory cell has been programmed. Thus, charge stored in the floating gate of the memory cell translates to a high voltage at the sensing node on the bitline and corresponds to a logic value of 0. Similarly, a low voltage at the sensing node on the bitline corresponds to a logic value of 1.

As discussed in the summary, it is an objective of the invention to reduce the time necessary to read a selected word line, thus increasing the speed of response. The timing diagrams for the precharging mechanism having the precharging scheme of the first embodiment are shown in FIGS. 4A–I. All input signals are applied to the control gate of transistors and memory elements. Prior to activation of the precharging and subsequent sensing/evaluation of the output signal at the SNS node, the voltage on the PRESET transistor 260 is approximately Vss. The voltage at the SNS node 210 and applied to the CNTRL 220, PROT 230, SG1 110, SG2 111 transistors and all word lines 150–168 are also set to Vss. The voltage applied to the pBIAS transistor 250 is set to approximately Vcc.

In the page buffer 105, the precharging sequence starts at time Tpc. At Tpc, Vcc is applied to the PRESET transistor 260 and the voltage applied to pBIAS 250 decreases to a predetermined voltage, turning on the p-channel pBIAS transistor 250. The pBIAS transistor 250 is biased over the precharging time such that it sources a current that is approximately 2–3 times that of the normal current in the bitline during sensing, the normal current in the bitline being 2 $\mu$A, for example. This increase in current allows the bitline to charge to the preset sensing voltage faster without increasing the current/voltage requirements of the chip severely. Also at Tpc, the voltage applied to the CNTRL transistor 220 is increased to maintain the voltage at the SNS node 210 at the sensing level of approximately 1.0 V. As the charge on the bitline increases, the CNTRL transistor 220 clamps the voltage at the SNS node 210 at the sensing voltage level. The voltage applied to the PROT transistor 230, if the PROT transistor 230 is present, is brought to at least Vcc during the precharge cycle.

All word line voltages applied to the individual memory elements in the core cell block 107, except the voltage applied to the word line to be read, are increased at Tpc. The non-read word line voltages are subsequently maintained throughout the entire precharge cycle and evaluation phase at a voltage large enough to turn the transistors on, whether or not they have been individually programmed.

In a first embodiment of the present invention, referred to as the strict pre-charge scheme, the voltage applied to the select gate transistors SG1 110 and SG2 111 during the precharge cycle are different. As shown in FIGS. 4E and 4F, the voltage applied to SG1 110 is large enough to turn the transistor on, while the voltage applied to SG2 111 remains constant at Vss. In this embodiment, the SNS node 210 charges to the original sensing level of approximately 1.0 V prior to the sensing/evaluation phase.

The evaluation phase occurs after the precharging cycle, at time Tsense. The voltages supplied to the transistors in the page buffer 105 are modified at Tsense. The voltage applied to the PRESET transistor 260 is decreased to Vss and the voltage applied to the pBIAS transistor 250 is increased such that the pBIAS transistor 250 sources the original sensing (non-precharging) current in the bitline. The voltage applied to the CNTRL transistor 220 remains constant to keep the SNS node 210 at the sensing voltage and the voltage applied to the PROT transistor 230 remains at Vcc so that the PROT transistor 230 is on, if the PROT transistor 230 is present.

Also occurring in the core cell block 107 at Tsense, the voltage applied to the SG2 111 transistor is increased such that the transistor is turned on. The voltage on the word line to be read is set at an intermediate level, in which the state of the floating gate determines whether or not the transistor is turned on.

In the above strict precharging scheme, the inputs (word lines) do not affect the voltage on the bitline until sensing begins. Little current flows through the core memory cell as the path to ground through the NAND chain is highly resistive. Thus, SG2 111 effectively decouples the inputs from ground when the select gate is not activated.

In a second embodiment, referred to as the pseudo-precharge scheme, the inputs are not decoupled from the bitline and thus can affect the voltage on the bitline 180 before sensing begins at time Tsense. FIGS. 5A–I show the timing diagrams associated with the pseudo-precharge scheme. The main difference between the pseudo-precharge scheme and the strict precharge scheme is the timing of the voltages applied to the select gate transistors SG1 110 and SG2 111. In the pseudo-precharge scheme both SG1 110 and SG2 111 turn on at the same time, Tpc, the time at which the PRESET 260 signal is high. The word lines of the memory cells that are not read are increasing so that the transistors are turning on at the same time and the pBIAS transistor 250 again sources 2–3 times the normal sensing current, as in the strict precharging scheme. The voltage of the word line to be read is maintained at Vss. If the specific memory cell has been erased, a path is created between the bitline 180 and ground and thus, the memory cell sinks current. In this case, the bitline 180 does not get charged all the way to the normal sensing voltage and consequently, sensing occurs at a lower voltage and higher current. For example, the new sensing voltage at SNS 210 may be only 600 mV, instead of the original sensing voltage of 1.0 V. In addition, the sensing time is decreased as the sensing voltage under the pseudo-precharge scheme is decreased.

As can be seen, the invention consists of a precharging mechanism and schemes for precharging the data lines of the memory cells of NAND-based flash devices. Modifications are made to the page buffers associated with the core cell blocks comprising the overall memory section of the flash memory device. The modifications necessary to effect the invention include both additional circuit elements and changes in the timing of signals applied to elements within both core cell blocks and page buffers.

While the invention has been described with reference to specific embodiments, the description is illustrative of the invention and not to be construed as limiting the invention. Various modifications and applications may occur to those skilled in the art without departing from the true spirit and scope of the invention as defined in the appended claims.

We claim:

1. A method for precharging a flash memory device comprising:
   a flash memory device including a plurality of core cell blocks containing flash memory cells, a plurality of bitlines, and a plurality of page buffers, each of said page buffers in communication with a portion of said core cell blocks via a unique bitline contained in said plurality of bitlines, said method comprising:
   charging at least one of said bitlines to a preset voltage during a portion of a precharge cycle, said at least one of said bitlines having a first current during said precharge cycle; and
   evaluating a logic state of at least one of said flash memory cells during said precharge cycle after at least one of said bitlines has attained said preset voltage, said at least one of said bitlines attaining said preset voltage having a second current during evaluation, said first current being not less than said second current,
   wherein each of said flash memory cells undergoing evaluation is connected with a unique bitline contained in said plurality of bitlines.

2. The method of claim 1 wherein said preset voltage is not greater than about one volt and said first current is not less than about four microamps.

3. The method of claim 1 for precharging a flash memory device, each of said plurality of page buffers further comprising a latch having two sides and a transistor connected with both said latch and ground, said method further comprising grounding one side of said latch contained in at least each of said page buffers connected with said at least one of said bitlines being charged via said transistor prior to said at least one of said bitlines attaining said preset voltage.

4. A method for precharging a flash memory device
   a flash memory device including a plurality of core cell blocks containing flash memory cells, a plurality of bitlines and a plurality of page buffers, each of said plurality of page buffers in communication with said a portion of said plurality of core cell blocks via a unique bitline contained in said plurality of bitlines, said method comprising the steps of:
   charging at least one of said bitlines to a preset voltage during a portion of a set precharge cycle;
   maintaining said preset voltage of said at least one of said bitlines for the duration of said precharge cycle, said at least one of said bitlines having a first current during said precharge cycle; and
   evaluating a logic state of at least one of said flash memory cells during an evaluation cycle, said evaluation cycle occurring after said precharge cycle, said at least one of said bitlines charged to said preset voltage having a second current during said evaluation cycle, said first current being not less than said second current, each of said flash memory cells undergoing evaluation connected with a unique bitline contained in said plurality of bitlines.

5. The method of claim 4 wherein said preset voltage is not less than about one volt and said second current is approximately two microamps.

6. The method of claim 4 for precharging a flash memory device, each of said plurality of page buffers further comprising a latch having two sides and a transistor connected with both said latch and ground, said method further comprising grounding one side of said latch contained in at least each of said page buffers connected with said at least one of said bitlines being charged via said transistor prior to said evaluation cycle.

7. A flash memory device comprising:
   at least one core cell;
   at least one memory element contained within said at least one core cell;
   at least one address line, each of said at least one memory element contained within said at least one core cells is addressed by one of said at least one address line;
   at least one bitline, each of said at least one bitline having a bitline voltage and having data produced on said each of said at least one bitline by a unique memory element connected with said at least one bitline; and at least one page buffer, each of said at least one page buffer connected with one of said at least one core cell through one of said at least one bitline, each of said at least one core cell being operative to output data through one of said at least one bitline to one of said at least one page buffer and each of said at least one page buffers containing a precharging mechanism, said precharging mechanism operative to precharge at least one of said at least one bitline to a predetermined voltage via a first current before a predetermined memory element of said at least one memory element contained in said each of said at least one core cells is addressed and a second current is present in said at least one of said at least one bitline after said predetermined voltage has been attained, said first current being not less than said second current.

8. The flash memory device of claim 7 wherein said first current is not less than about twice said second current.

9. The flash memory device of claim 8 wherein said predetermined voltage is not less than one volt.

10. The flash memory device of claim 8 wherein said second current is approximately two microamps.

11. The flash memory device of claim 7 wherein said first current and said second current are approximately equal to each other.

12. The flash memory device of claim 11 wherein said first current and said second current individually are not less than about four microamps.

13. The flash memory device of claim 11 wherein said predetermined voltage is not greater than about one volt.

14. The flash memory device of claim 7 wherein each of said at least one page buffer of said flash memory device further comprises a latch having two sides, said precharging mechanism comprising a transistor connected with both one side of said latch and ground, said transistor operative to ground said one side of said latch prior to said predetermined voltage being attained.

15. A page buffer for a flash memory device comprising:

a precharging mechanism, said precharging mechanism operative to precharge a bitline connected with said precharge mechanism to a predetermined voltage via a first current before a predetermined memory element connected with said bitline is addressed and a second current is present in said bitline after said predetermined voltage has been attained, said first current being not less than said second current.

16. The page buffer of claim 15 further comprising a latch having two sides, said precharging mechanism comprising a transistor connected with both one side of said latch and ground, said transistor operative to ground one side of said latch prior to said second current being present.

17. The page buffer of claim 16 wherein said predetermined voltage is not greater than about one volt and said first and second currents are equal to each other and not less than about four microamps.

18. The page buffer of claim 16 wherein said predetermined voltage is not not greater than about one volt and said first current not less than about twice said second current, said second current being approximately two microamps.

* * * * *